United States Patent [19]
Mizrahi et al.

[11] Patent Number: 5,943,152
[45] Date of Patent: Aug. 24, 1999

[54] LASER WAVELENGTH CONTROL DEVICE

[75] Inventors: Victor Mizrahi, Columbia; Stephen R. Harmon, Severn, both of Md.

[73] Assignee: CIENA Corporation, Linthicum, Md.

[21] Appl. No.: 08/848,423

[22] Filed: May 8, 1997

Related U.S. Application Data

[63] Continuation-in-part of application No. 08/605,856, Feb. 23, 1996, Pat. No. 5,673,129.

[51] Int. Cl.$^6$ ...................................................... H04B 10/04
[52] U.S. Cl. ............................ 359/187; 359/110; 372/34
[58] Field of Search .................................... 359/110, 124, 359/157, 161, 187; 385/24; 372/34

[56] References Cited

U.S. PATENT DOCUMENTS

| | | | |
|---|---|---|---|
| 4,485,475 | 11/1984 | Large et al. | 372/32 |
| 4,719,358 | 1/1988 | Matsumoto et al. | 250/551 |
| 4,922,480 | 5/1990 | Bosch | 372/3 |
| 4,942,568 | 7/1990 | Khoe et al. | 370/3 |
| 4,989,201 | 1/1991 | Glance | 359/133 |
| 5,042,898 | 8/1991 | Morey et al. | 385/37 |
| 5,077,816 | 12/1991 | Glomb et al. | 385/37 |
| 5,267,073 | 11/1993 | Tamburello et al. | 359/179 |
| 5,299,212 | 3/1994 | Koch et al. | 372/32 |
| 5,333,089 | 7/1994 | Heidemann | 359/341 |
| 5,387,992 | 2/1995 | Miyazaki et al. | 359/124 |
| 5,457,760 | 10/1995 | Mizrahi | 385/37 |
| 5,475,780 | 12/1995 | Mizrahi | 385/37 |
| 5,485,581 | 1/1996 | Ventrudo et al. | 372/6 |
| 5,589,970 | 12/1996 | Leju et al. | 319/133 |
| 5,696,859 | 12/1997 | Onaka et al. | 385/24 |
| 5,706,301 | 1/1998 | Lagerstrom | 372/32 |

FOREIGN PATENT DOCUMENTS

| | | |
|---|---|---|
| 0436202 | 7/1991 | European Pat. Off. |
| 0653652 | 5/1995 | European Pat. Off. |
| 3-219326 | 1/1991 | Japan . |
| 9707577 | 2/1997 | WIPO . |

OTHER PUBLICATIONS

Patent Abstracts Of Japan–Publication No. 60096935.
Patent Abstracts Of Japan–Publication No. 09186657.
Thylen et al., LEOS '96, Boston, Nov. 18–19, 1996, vol. 1, pp. 26–27.
Woodward et al., IEEE Photonics Technology Letters, vol. 5, No. 6, pp. 628–630.
Ashish et al., *IEEE Journal of Lightwave Technology*, vol. 14, No. 1, Jan. 1996, pp. 58–65.
Woodward et al., *IEEE Photonics Technology Letters*, vol. 5, No. 6, Jun. 1993, pp. 628–630.
Bilodeau et al., *IEEE Photonices Technology Letters*, vol. 6, No. 1, Jan. 1994, pp. 80–82.
Chung et al., *IEEE Photonics Technology Letters*, vol. 6, No. 7, Jul. 1994, pp. 792–795.
Kashyap et al. *IEEE Photonics Technology Letters*, vol. 5, No. 2, Jan. 1994, pp. 80–82.
Erdogan et al., *J. Appl. Phys.*, vol. 76, No. 1, Jul. 1994, pp. 73–80.

*Primary Examiner*—Kinfe-Michael Negash
*Attorney, Agent, or Firm*—David L. Soltz

[57] ABSTRACT

A laser control system is disclosed including a microprocessor, which precisely adjusts the wavelength of light output from the laser by monitoring the transmissivity of an in-fiber Bragg grating coupled to the output of the laser. The Bragg grating is fabricated to have a minimum transmissivity at the desired output wavelength of the laser. The microprocessor continually adjusts the wavelength of the laser output to obtain substantially minimal transmissivity through the grating. At which point, the laser is locked to the desired wavelength. Alternatively, the microprocessor can monitor light reflected from the grating, and continually adjust the wavelength of the laser output to lock the laser at a wavelength providing substantially maximum reflectance by the grating.

38 Claims, 6 Drawing Sheets

LASER WAVELENGTH CONTROL DEVICE

This application is a continuation-in-part of application Ser. No. 08/605,856 filed Feb. 23, 1996 now U.S. Pat. No. 5,673,129 titled "WDM Optical Communication Systems With Wavelength Stabilized Optical Selectors".

FIELD OF THE INVENTION

The present invention is directed to a system and related method for controlling the wavelength of light output from a laser.

Optical communication systems are a substantial and fast growing constituent of communication networks. The expression "optical communication system," as used herein, relates to any system which uses optical signals to convey information across an optical waveguiding medium, for example, an optical fiber. Such optical systems include but are not limited to telecommunication systems, cable television systems, and local area networks (LANs). Optical systems are described in Gowar, Ed. *Optical Communication Systems,* (Prentice Hall, New York) c. 1993, the disclosure of which is incorporated herein by reference. Currently, the majority of optical communication systems are configured to carry an optical channel of a single wavelength over one or more optical waveguides. To convey information from plural sources, time-division multiplexing is frequently employed (TDM). In time-division multiplexing, a particular time slot is assigned to each signal source, the complete signal being constructed from the portions of the signals collected from each time slot. While this is a useful technique for carrying plural information sources on a single channel, its capacity is limited by fiber dispersion and the need to generate high peak power pulses.

While the need for communication services increases, the current capacity of existing waveguiding media is limited. Although capacity may be expanded e.g., by laying more fiber optic cables, the cost of such expansion is prohibitive. Consequently, there exists a need for a cost-effective way to increase the capacity of existing optical waveguides.

Wavelength division multiplexing (WDM) has been explored as an approach for increasing the capacity of existing fiber optic networks. WDM systems typically include a plurality of transmitters, each respectively transmitting signals on a designated one of a plurality of channels or wavelengths. The channels are combined by a multiplexer at one end terminal and transmitted on a single fiber to a demultiplexer at another end terminal where they are separated and supplied to respective receivers.

Generally, a plurality of erbium doped fiber amplifiers are provided at nodes spaced along the fiber between the multiplexer and demultiplexer in order to regenerate the optical signal transmitted on the fiber. These erbium doped fibers optimally amplify in a relative narrow range of wavelengths centered about 1550 nm. Thus, the transmitters preferably transmit at respective wavelengths within this range. Since the transmitted wavelengths are relatively close to each other, typically less than 1 nm apart, these wavelengths must be precisely controlled in order to insure integrity of the transmitted information.

SUMMARY OF THE INVENTION

Consistent with the present invention, a microprocessor is used to precisely control the wavelength of light generated by a laser based upon an optical output of the laser.

Moreover, in accordance with the present invention, a method of regulating a wavelength of light output from a laser is provided comprising the steps of: driving the laser to output light at a first wavelength; transmitting the light through a variably transmissive element having a transmission characteristic whereby a minimum transmissivity is obtained at a predetermined wavelength; increasing the wavelength in first increments until a transmissivity of the transmissive element increases at a second wavelength; decreasing the wavelength in second increments until the transmissivity of the light increases at a third wavelength; and adjusting the wavelength to be a fourth wavelength between said second and third wavelengths.

Further, in accordance with the present invention, a method of regulating a wavelength of light output from a laser is provided comprising the steps of: driving the laser to output the light at a first wavelength; reflecting the light off a partially reflective element having a variable reflectivity characteristic whereby a maximum reflectivity is obtained a predetermined wavelength; increasing said wavelength in first increments until a reflectivity of the partially reflective element decreases at a second wavelength; decreasing the wavelength in second increments until the reflectivity of the reflective element decreases at a third wavelength; and adjusting the wavelength to be a fourth wavelength between the second and third wavelengths.

BRIEF DESCRIPTION OF THE DRAWINGS

Advantages of the present invention will be apparent from the following detailed description of the presently preferred embodiments thereof, which description should be considered in conjunction with the accompanying drawings in which.

DETAILED DESCRIPTION

In accordance with the present invention, a microprocessor precisely controls the wavelength of light output from a laser by monitoring the transmissivity of a selectively reflective element, such as an in-fiber Bragg grating, coupled to the output of the laser. The Bragg grating has a minimum transmissivity at the desired output wavelength of the laser. The microprocessor continually adjusts the wavelength of the laser output to obtain substantially minimal transmissivity through the grating. At which point, the laser is locked to the desired wavelength. Alternatively, the microprocessor can monitor light reflected from the grating, and continually adjust the wavelength of the laser output to lock the laser at a wavelength providing substantially maximum reflectance by the grating.

Figure 1:
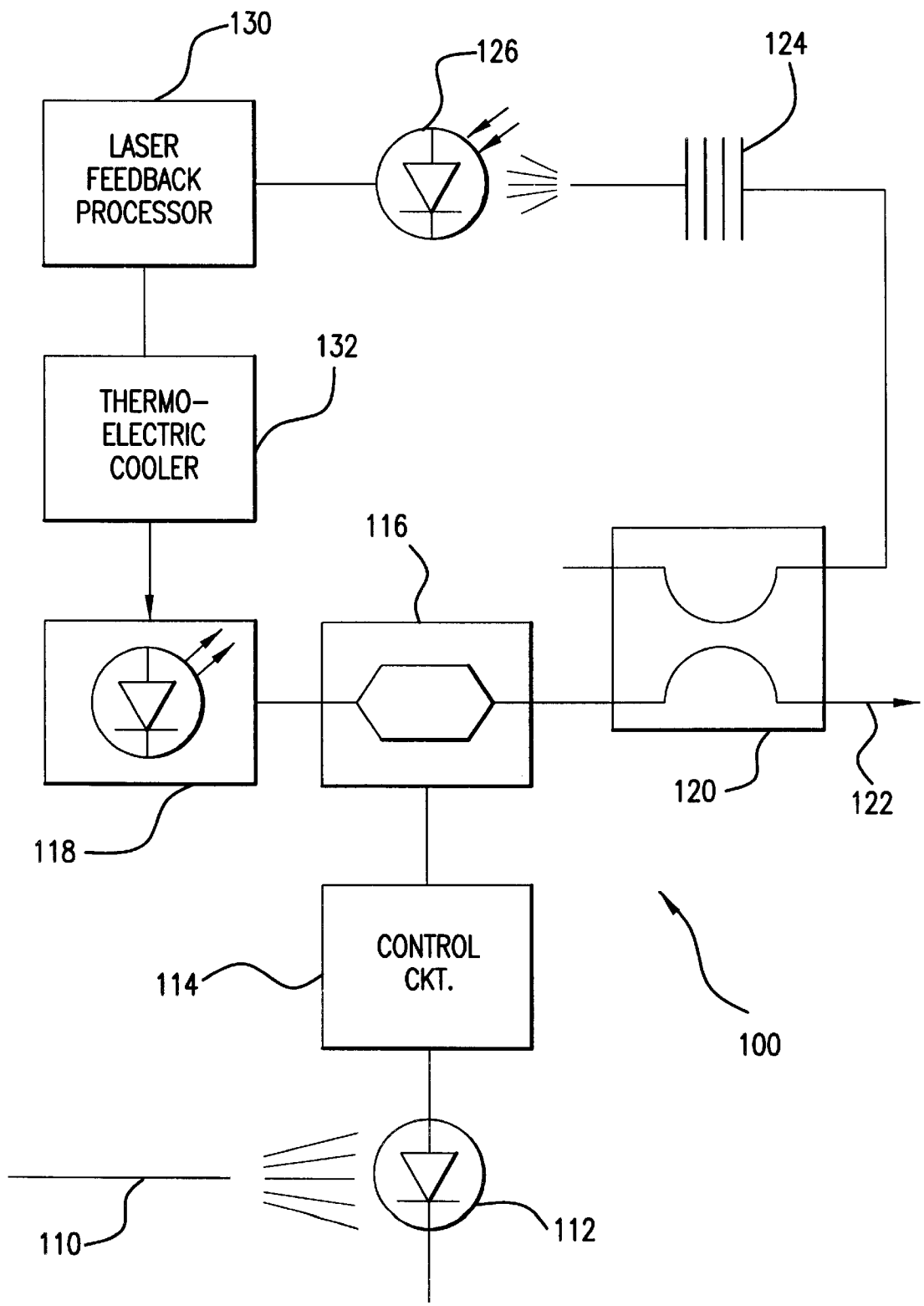
FIG. 1 is a schematic diagram of a wavelength conversion module in accordance with the present invention.

Turning to the drawings in which like reference characters indicate the same or similar elements in each of the several views, FIG. 1 illustrates a wavelength conversion module or remodulator 100 in accordance with the present invention. Remodulator 100 receives an optical input from fiber 110, which is typically at a wavelength within the range of 1300 to 1600 nm, and is frequently different than the desired transmission wavelength to be amplified by erbium doped fibers. The optical input typically includes light pulses corresponding to digital communication data from a SONET terminal, for example. Detector 112, a photodiode, for example, senses these light pulses and generates an electrical signal comprising first electrical pulses in response thereto. The electrical signal is supplied to control circuit 114, which generates corresponding second electrical pulses of appropriate duration and amplitude for driving external modulator 116.

External modulator 116, a Mach-Zehnder modulator, for example, typically employs a waveguiding medium whose refractive index changes according to an applied electrical field. In the Mach-Zehnder modulator, two optical interferometer paths are provided. An incoming optical carrier is split between the two optical paths, at least one of which is supplied to the waveguiding medium where it is phase modulated by the applied electric field. When the signal is recombined at the output, the light from the paths either constructively or destructively interferes, depending upon the electrical field applied to the surrounding electrodes during the travel time of the carrier. As a result, an amplitude modulated output optical signal can be obtained.

Returning to FIG. 1, the amplitude modulated output from modulator 116 is supplied to a coupler 120, which transmits most of the received light to output fiber 122 and to the amplifiers, and a remaining portion to a filtering or partially reflective element 124. Partially reflective element 124 typically includes an in-fiber Bragg grating, such as one described in Morey et al., *Photoinduced Bragg Gratings in Optical Fibers,* Optics & Photonics News, February 1994, incorporated by reference herein. Grating 124 typically has a minimum transmissivity at a wavelength corresponding to the desired output of laser 118, which is typically a DFB (distributed feedback) semiconductor diode laser generally comprising one or more III–V semiconductor materials commercially available from a wide variety of suppliers such as Fujitsu, BT&D, GEC Marconi, and Hewlett-Packard. In the embodiment illustrated in FIG. 1, long period gratings having periods exceeding 100 $\mu$m can also be used. Long period gratings are described in A. M. Vengsarkar et al., *Long-Period Fiber Gratings As Band-Rejection Filters,* Journal of Lightwave Technology, vol. 14, no. 1, January 1996, pp. 58–65, the disclosure of which is incorporated herein by reference.

Photodetector 126 senses light transmitted through grating 124, and generates electrical signals in response thereto. These electrical signals are supplied to a control circuit, which may be a hardwired component or a microprocessor, e.g., laser feedback control processor 130 (typically a general purpose microprocessor such as a 68302 microprocessor manufactured by Motorolla), which, in turn, supplies an appropriate output control voltage, usually a DC voltage, to a thermoelectric cooler 132. As is generally understood in the art, the temperature of thermoelectric cooler 132 is adjusted in response to a voltage applied thereto. Accordingly, laser 118 is preferably thermally coupled to thermoelectric cooler 132 so that its temperature can be accurately controlled. Typically, thermoelectric cooler 132 can control the temperature of laser 118 within a range of 15–45° C. Thus, for example, processor 130 can generate output control voltages in at least 1 mV increments, which results in precise incremental changes in temperature in the range of 0.01–0.05° C.

Generally, the wavelength of light output from laser 118 is inversely related to the temperature of laser 118. Accordingly, by changing the temperature of thermoelectric cooler 132, processor 130 can alter the wavelength of light output from laser 118.

A detailed description of a method for controlling of laser 118 will be presented below with reference to FIGS. 2 and 3. Generally, the method is carried out in accordance with a program stored in a memory associated with processor 130.

Figure 2:
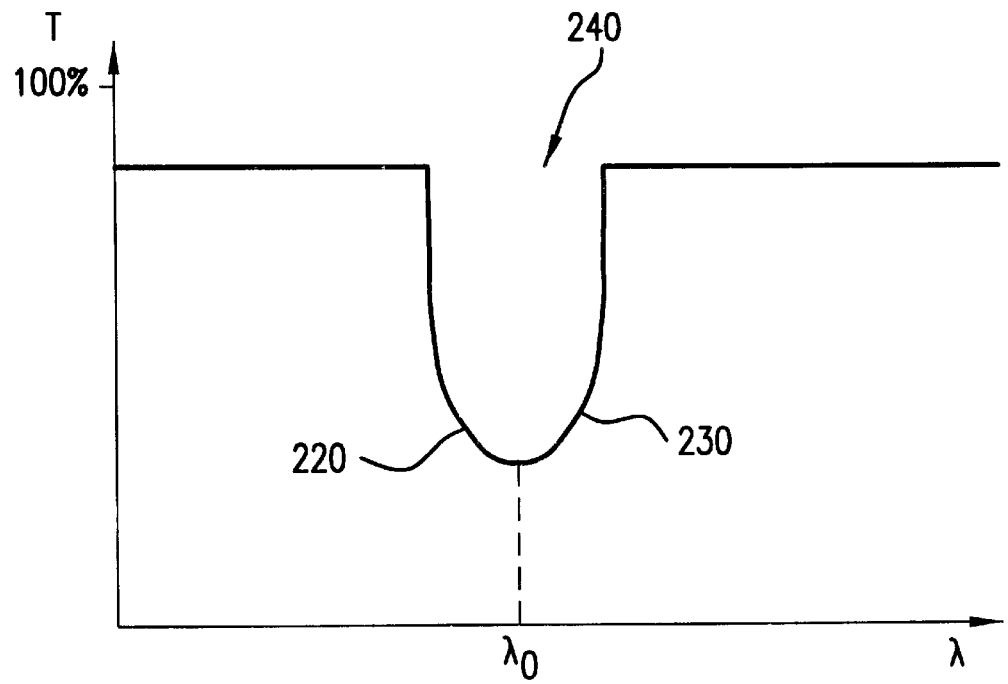
FIG. 2 illustrates a transmissivity characteristic of in-fiber Bragg grating 124 shown in FIG. 1.

As seen in FIG. 2, grating 124 has a transmission characteristic which is high (greater than 60%, for example) for wavelengths significantly greater or less than a predetermined wavelength $\lambda_0$. At wavelengths approximating $\lambda_0$, however, much of the incoming light is reflected by the grating and transmissivity dips below $_{60}$%, with the minimum transmissivity occurring at $\lambda_0$. Accordingly, the transmissivity characteristic curve shown in FIG. 2 has a "well" 240 centered about $\lambda_0$ with sloping sides 220 and 230.

Figure 4:
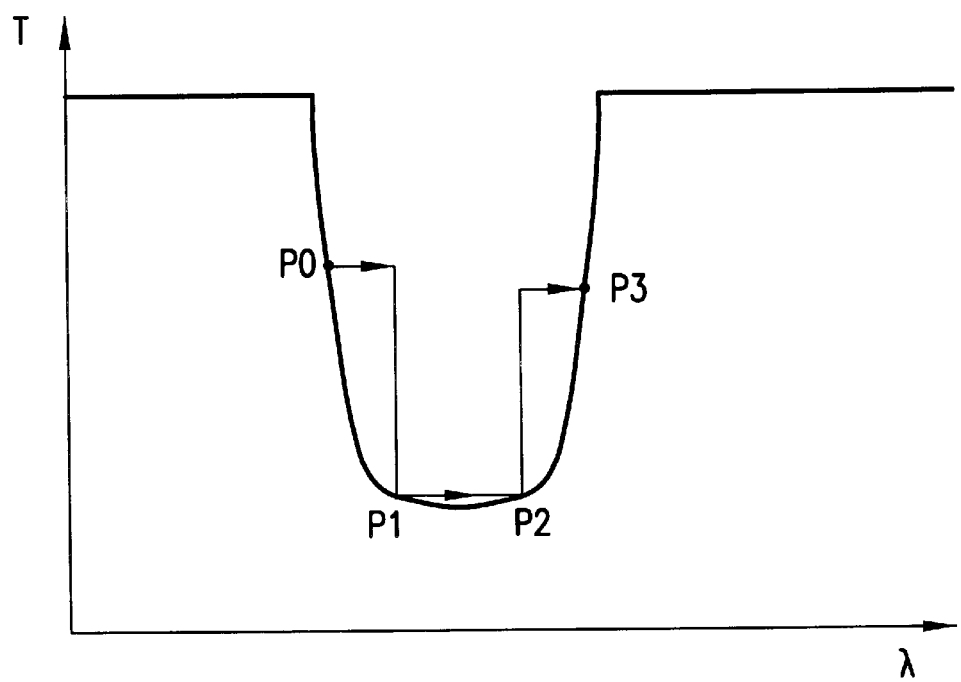
FIG. 4 illustrates exemplary adjustments to the wavelength of light output from laser 118 and resulting changes in transmissivity along the plot shown in FIG. 2.
Figure 3:
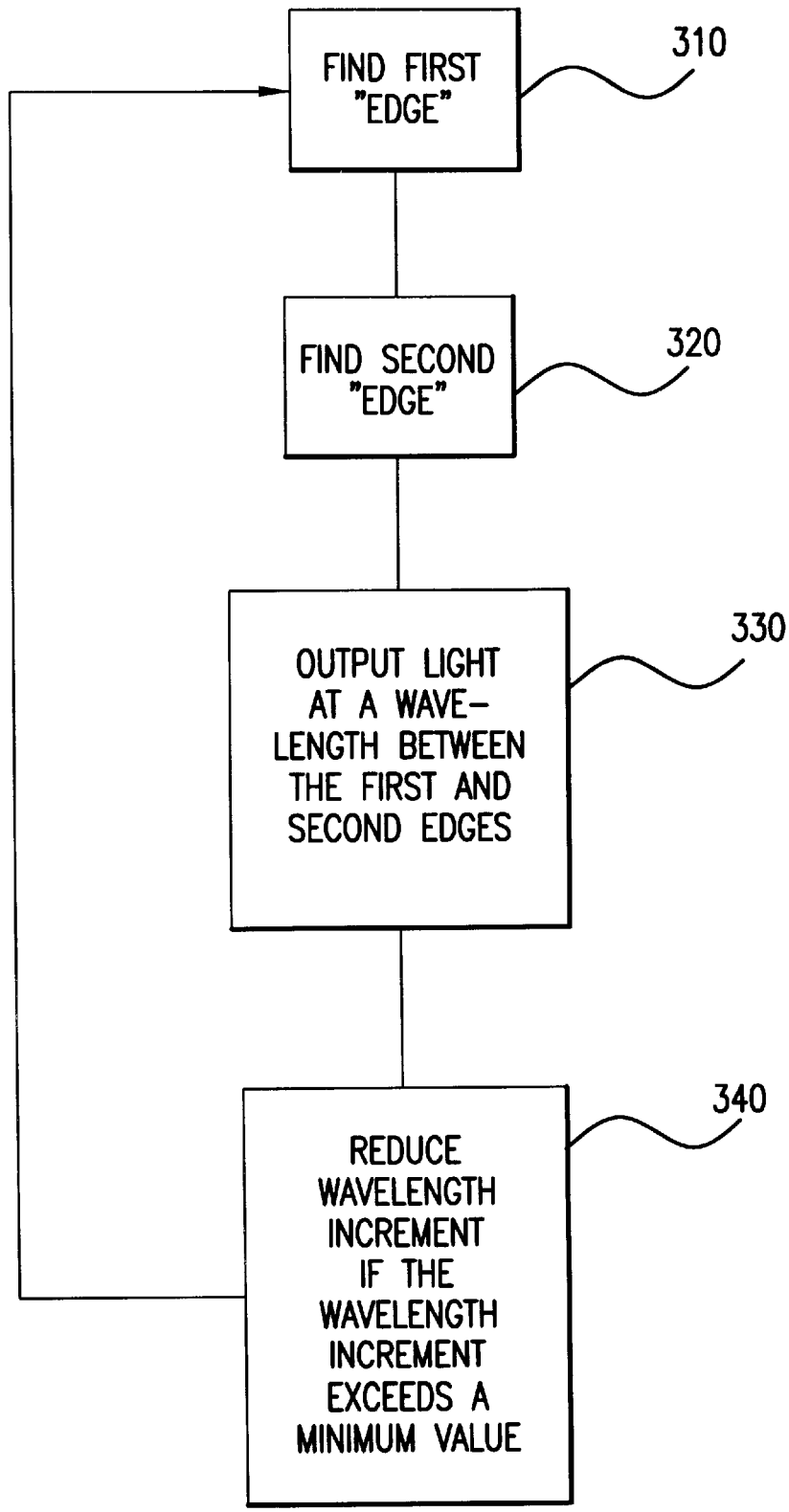
FIG. 3 illustrates a generalized flow chart of a process for controlling the wavelength output from laser 118 in accordance with the present invention.
Figure 5:
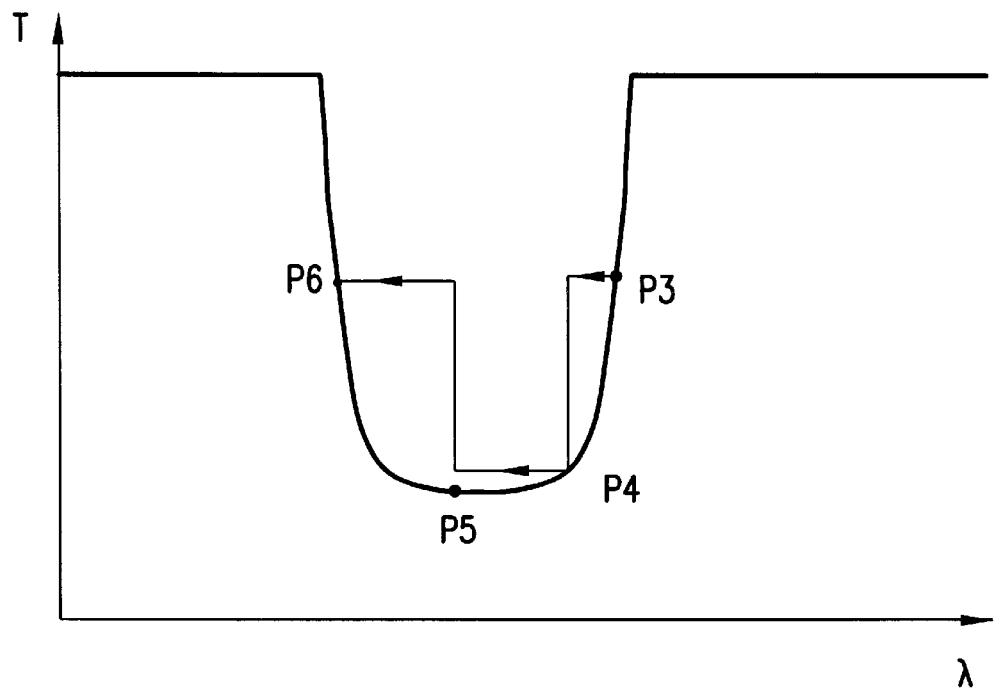
FIG. 5 illustrates additional exemplary adjustments to the wavelength of light output from laser 118 and resulting changes in transmissivity along the plot shown in FIG. 2.

Generally, after processor 130 sets the output wavelength of laser 118 to an initial value relatively close to $\lambda_0$, the wavelength is either increased or decreased in relatively large increments until a first "edge" of well 240 is detected, i.e., a wavelength at which the transmissivity increases (step 310, FIG. 3). Thus, for example, as shown in FIG. 4, laser 118 may be set to an initial wavelength at point P0 on the transmittance curve. The wavelength may then be increased in relatively large increments through points P1 and P2 until the transmittance increases at a wavelength at point P3. Point P3 corresponds to a first edge. A second edge is then identified by decreasing the wavelength output from laser 118 in relatively large increments until a second edge is located (step 320, FIG. 3). For example, as seen in FIG. 5, the wavelength is incrementally decreased through points P4 and P5, until the transmittance increases at point P6. Laser 118 is then controlled to output light at a wavelength between the wavelengths at points P3 and P6 is then output (step 330, FIG. 3) and the wavelength increment is reduced by some factor, e.g., ½ (step 340, FIG. 3). It should be noted, however, that although the step of increasing the wavelength to locate the first edge has been described as preceding the step of decreasing the wavelength to locate the second edge, it is also contemplated that the wavelength may be decreased to locate the first edge prior to increasing the wavelength to locate the second edge.

Processor 130 continuously cycles through steps 310–340. With each successive iteration, the wavelength increment is reduced, the first and second edges are brought closer together, and a new midpoint wavelength is set. The wavelength increment is decreased until it reaches a minimum predetermined value. At which point, processor 130 repeats the steps of locating first and second edges and setting the midpoint wavelength between the two, but with no further reduction in the incremental changes in wavelength. As a result, the output wavelength is confined to within a narrow range in the "cusp" of well 240 and is substantially equal to the desired wavelength.

Figure 6:
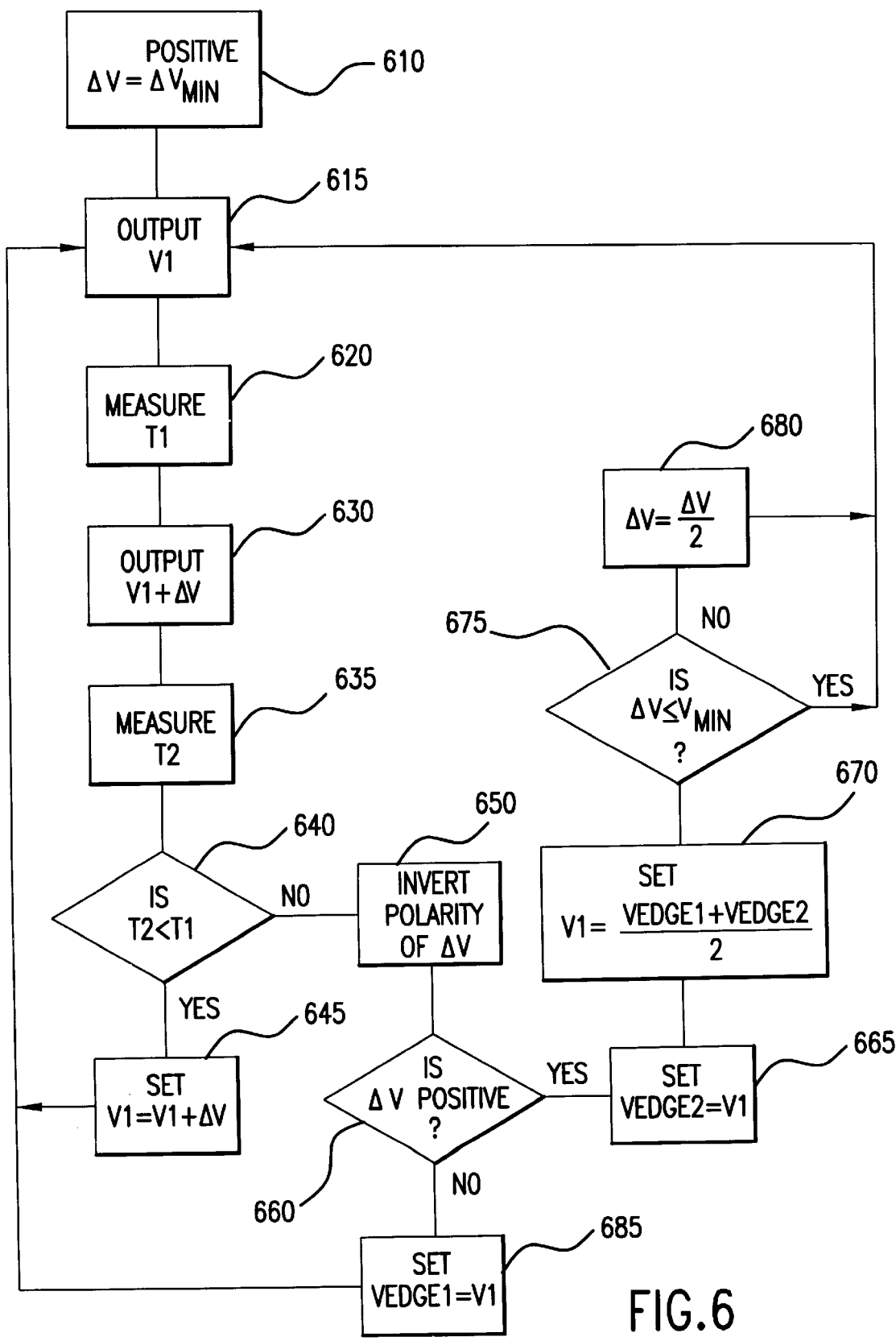
FIG. 6 illustrates a detailed flow chart of the process of controlling the wavelength of light output from laser 118 in accordance with the present invention.

FIG. 6 illustrates in greater detail the process used to control laser 118. In initial step 610, output control voltage increment $\Delta V$ is initialized to a relatively large value $\Delta V$max and assigned a positive polarity, for example. As noted above, changes in the control voltage output from processor 130 cause changes in the temperature of laser 118, resulting in corresponding changes in the wavelength of light output from laser 118. Thus, ΔV corresponds to the incremental change in wavelength of light output from laser 118, such that a large ΔV translates to large changes in output wavelength while a small ΔV translates to a small change in wavelength.

In step 615 an initial voltage V1 is output from processor 130. This initial voltage can be, for example, a previously stored voltage corresponding to a temperature of thermoelectric cooler 132 which results in an output wavelength within well 240 and preferably close to the desired output wavelength $\lambda_0$. In step 620, the transmissivity T1 with output control voltage V1 is measured by sensing a voltage output from detector 126 (FIG. 1). The output control voltage is then increased by ΔV in step 630, and the resulting transmittance T2 is measured in step 635.

In step 640, a comparison is made to determine whether T2 (the transmittance at V1+ΔV) is less than T1 (the transmittance at V1). If yes, processor 130 assumes that an edge has not been reached. Accordingly, V1 is set equal to V1+ΔV (step 645), and; processor 130 repeats steps 615–640. If T2 is greater than T1, however, processor 130 assumes that an edge has been detected. In which case, processor 130 will now attempt to find the second edge of well 240. Thus, the program branches and, in step 650, ΔV is inverted to negative polarity, indicating that the output control voltage, at this point, is to be decreased incrementally by amounts ΔV. Here, in step 660, a determination is made as to whether ΔV is positive. Since it is not at this stage, VEDGE1 is set to voltage V1 (step 685), and the value of the control output voltage associated with the first edge is temporarily stored in a scratch memory associated with processor 130. Processor 130 again cycles through steps 615–645, thereby decrementing the output control voltage until the second edge is determined, i.e., when T2 is greater than T1. The polarity of ΔV is again inverted in step 650, at this point from negative to positive polarity. In step 660, since ΔV is positive, the program branches and sets VEDGE2 equal to V1, i.e., the output control voltage generating the wavelength at the second edge is stored in processor 130 (step 665). V1 is then set to a voltage midway between VEDGE1 and VEDGE2 (step 670). If ΔV is less than a minimum value ΔVmin (step 675), no further reduction in ΔV is required. On the other hand, if ΔV exceeds ΔVmin, ΔV is reduced by some factor, e.g., ½, in step 680 so that the output control voltage is adjusted in smaller increments.

Processor 130 returns to step 615 to output voltage V1, now equal to a voltage between VEDGE1 and VEDGE2, thereby setting the temperature of laser 118 so that a wavelength substantially between the wavelengths at the first and second edges is output from laser 118. Processor 130 next continuously cycles through the above steps to locate edges within well 240, supply new midpoint output control voltages, and decrease the incremental control voltage ΔV with each iteration until ΔV is equal to ΔVmin. Thus, as noted above, the edges are spaced closer, and after several iterations, the output wavelength is adjusted to be within the cusp of well 240. At this point, the wavelength of light output from laser 118 is typically within approximately 0.02 nm of $\lambda_0$, and the frequency of the output light is within 2 GHz of a frequency corresponding to $\lambda_0$. Laser 118 is thus considered locked at wavelength $\lambda_0$.

Typically, gratings with a narrow spectral width will provide a "tighter" lock in which the wavelength of light output from laser 118 deviates little from $\lambda_0$. Accordingly, gratings having a spectral width of approximately 1 angstrom are generally used, although gratings having broader spectral widths can be utilized as well.

Typically, processor 130 monitors the temperature of laser 118 to insure that it is substantially constant or has stabilized prior to measuring the transmittance through grating 124. Such temperature stabilization usually occurs about 1–5 seconds after a new output control voltage is supplied to thermoelectric cooler 132. Moreover, the temperature of grating 124 can be continuously monitored so that if it falls outside a predetermined range, an alarm signal can be generated and processor 130 will cease monitoring of laser 118 and will cease stepping the voltage supplied to thermoelectric cooler 132. In which case, processor 130 can notify the user of a fault with grating 124. Further, if the intensity of light sensed by detector 126 falls outside a predetermined range, processor 130 can generate the alarm signal, thereby indicating a fault with laser 118 or detector 126.

Figure 7:
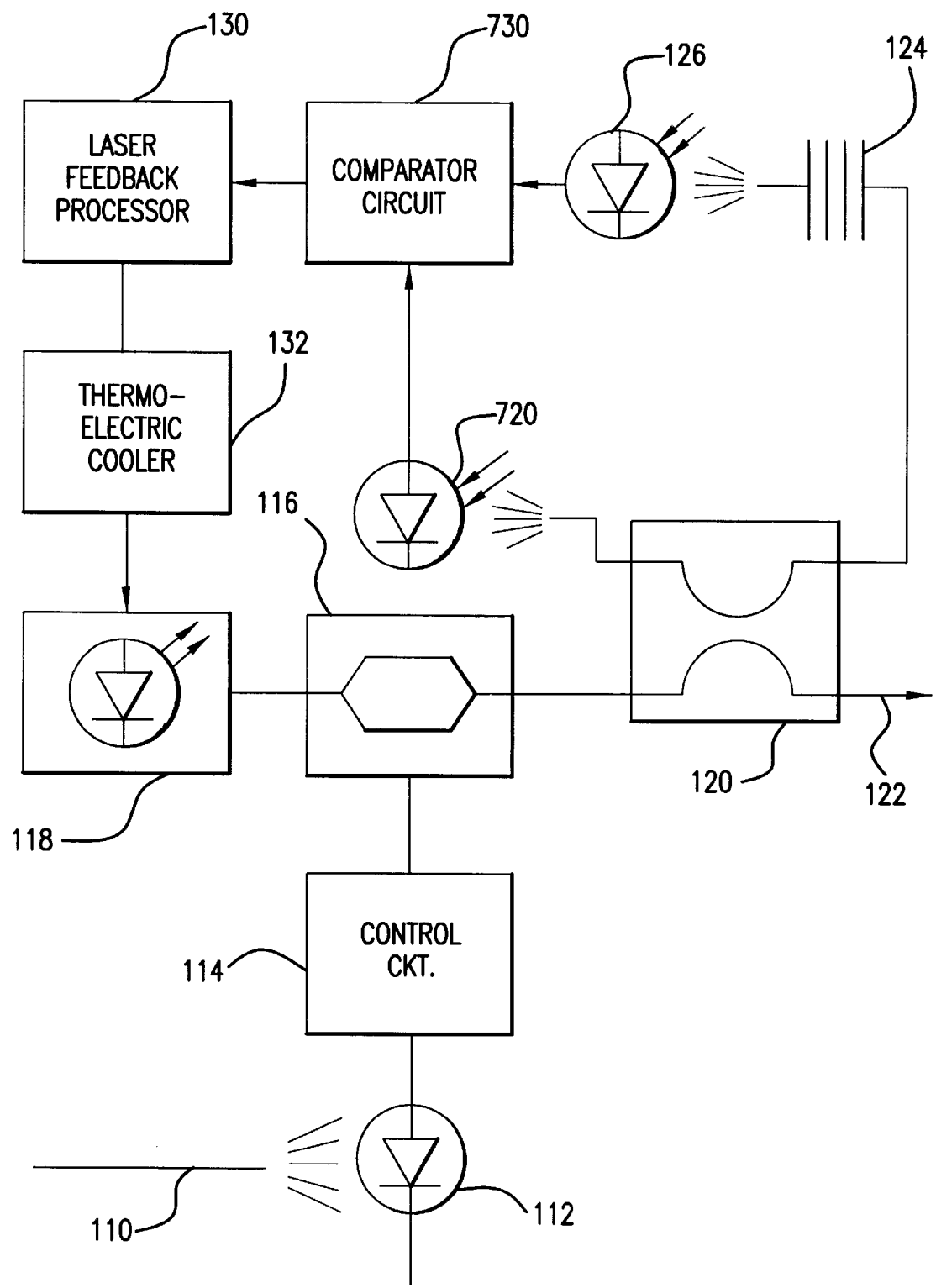
FIG. 7 illustrates a wavelength conversion module in accordance with a further embodiment of the present invention.

FIG. 7 illustrates a second embodiment of the present invention. The second embodiment differs from the first embodiment in that it includes a second photodetector 720 and comparator circuit 730. In accordance with the second embodiment, grating 124 is both reflective and transmissive at $\lambda_0$. For example, the maximum reflectivity of grating 124 at $\lambda_0$ is 70% of incident optical power and the corresponding minimum transmissivity is 30%. As further shown in FIG. 7, light reflected by grating 124 through coupler 120 is sensed by photodetector 720, which generates a voltage signal Vrefl. Photodetector 126, however, detects the amount of light transmitted through grating 124, and outputs a voltage signal Vtrans, in response thereto. Typically, comparator circuit 730 is configured to receive signals Vrefl and Vtrans and output a potential representative of a deviation of the actual wavelength output from laser 118 and the desired wavelength $\lambda_0$. For example, the output of comparator circuit 730 may be substantially equal to (Vtrans+Vrefl)/Vtrans. Alternatively, the outputs of photodetectors 126 and 720 may be supplied directly to processor 130, which is appropriately programmed to obtain the quantity (Vtrans+Vrefl)/Vtrans.

The same process described above is preferably followed to adjust the output of laser 118 to be within the cusp of well 240. The second embodiment, however, is advantageous in that variations in the power output of laser 118, which would otherwise cause the transmission characteristic to shift up or down, are canceled out.

Figure 8:
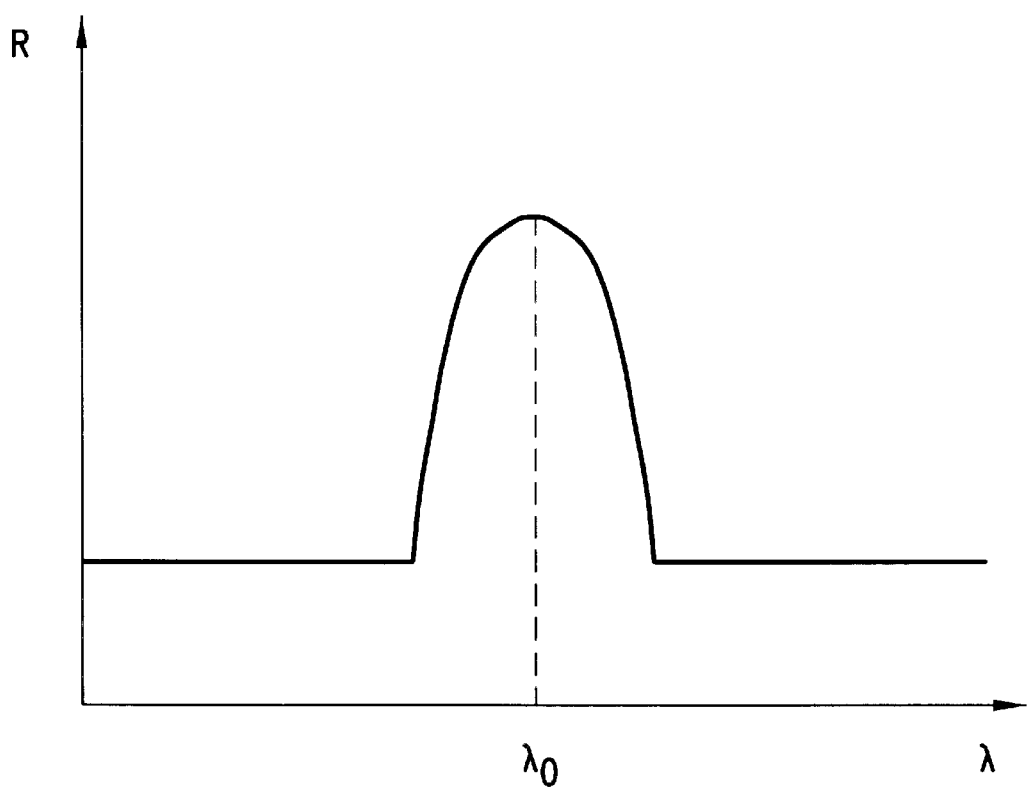
FIG. 8 illustrates a reflectivity characteristic of in-fiber Bragg grating 124.

In accordance with a third embodiment, detector 126 and comparator circuit 730 can be omitted such that laser feedback processor 130 monitors the reflectivity of grating 124 by receiving Vrefl only. As shown in FIG. 8, the reflectivity characteristic of grating 124 typically has a maximum reflectance or peak at $\lambda_0$. In order to lock laser 118 within a narrow range about $\lambda_0$, processor 130, in this instance follows substantially the same process described above with reference to FIG. 6 with the exception that reflectivity of grating 124 is monitored instead of transmissivity. Moreover, edges are identified at wavelengths where the reflected light decreases, not where transmissivity increases. Thus, at step 640, for example, the program will branch to invert the polarity of ΔV if the reflectivity at V1 is less than the reflectivity at V1+ΔV. Otherwise, the program is substantially the same, and the wavelength will be adjusted to within a narrow range substantially centered about the peak of the reflectivity characteristic.

Further, in accordance with a fourth embodiment the circuit shown in FIG. 7 may be used to cancel out optical power variations, while restricting the wavelength of light output from laser 118 to be substantially centered at the reflectivity peak. In which case, however, comparator circuit 730 can be appropriately configured, for example, to supply the quantity (Vtrans+Vrefl) Vrefl to processor 130. Alternatively, comparator circuit 730 may be omitted, and processor 130 may be appropriately programmed to generate this parameter in response to direct application of Vrefl and Vtrans.

While the foregoing invention has been described in terms of the embodiments discussed above, numerous variations are possible. Accordingly, modifications and changes such as those suggested above, but not limited thereto, are considered to be within the scope of the following claims.

What is claimed is:

1. An optical device, comprising:
   a first source of light, said light having a first wavelength dependent upon a temperature of said first source;
   a filtering element coupled to said first source of said light;
   a first photoelectric conversion device configured to detect a portion of said light transmitted through said filtering element and generate an electrical sense signal in response thereto;
   a control circuit coupled to said first photoelectric conversion device;
   a temperature regulating device coupled to receive a control signal generated by said control circuit in response to said electrical sense signal, said temperature regulating device adjusting a temperature of said first light source in response to said control signal to thereby adjust said first wavelength;
   a second source of light at a second wavelength different than said first wavelength;
   a second photoelectric conversion device coupled to said second source and generating a detection signal in response to said light at said second wavelength for modulating said light at said first wavelength; and
   a circuit coupled to said second photoelectric conversion device, said second photoelectric conversion device supplying said detection signal to said circuit, said circuit being configured to facilitate modulation of said light at said first wavelength.

2. An optical device in accordance with claim 1, wherein said circuit further comprising:
   a modulation circuit coupled to receive said detection signal, said modulation circuit outputting a modulation signal in accordance with said detection signal; and
   an optical modulator configured to receive said modulation signal to thereby modulate said light at said first wavelength.

3. An optical device in accordance with claim 1, wherein said source of light comprises a laser.

4. An optical device in accordance with claim 1, wherein said filtering element comprises an in-fiber Bragg grating.

5. An optical device in accordance with claim 1, wherein said filtering element has a transmission characteristic whereby a minimum transmittance is obtained at a predetermined wavelength, said first wavelength being substantially equal to said predetermined wavelength.

6. An optical device in accordance with claim 1, wherein said optical modulator comprises a Mach-Zehnder interferometer.

7. An optical device comprising:
   a first source of light at a first wavelength, said first wavelength being dependent upon a temperature of said first source;
   a reflective element coupled to said source of said first light;
   a first photoelectric conversion device configured to detect a portion of said light reflected by said reflective element and generate an electrical sense signal in response thereto;
   a control circuit coupled to said first photoelectric conversion device;
   a temperature regulating device coupled to receive a control signal generated by said control circuit in response to said electrical sense signal, said temperature regulating device adjusting a temperature of said first light source in response to said control signal to thereby adjust said first wavelength;
   a second source of light at a second wavelength different than said first wavelength;
   a second photoelectric conversion device coupled to said second source and generating a detection signal in response to said light at said second wavelength [for modulating said light at said first wavelength]; and
   a circuit coupled to said second photoelectric conversion device, said second photoelectric conversion device supplying said detection signal to said circuit, said circuit being configured to facilitate modulation of said light at said first wavelength.

8. An optical device in accordance with claim 7, wherein said circuit further comprising:
   a modulation circuit coupled to receive said detection signal, said modulation circuit outputting a modulation signal in accordance with said detection signal; and
   an optical modulator configured to receive said modulation signal to modulate said light at said first wavelength.

9. An optical device in accordance with claim 7, wherein said reflective element comprises an in-fiber Bragg grating.

10. An optical device in accordance with claim 7, wherein said reflective element has a reflectivity characteristic whereby a maximum reflectance is obtained at a predetermined wavelength, said control circuit adjusting said wavelength to be substantially equal to said predetermined wavelength.

11. An optical device in accordance with claim 7, wherein said optical modulator circuit comprises a Mach-Zehnder interferometer.

12. An optical device comprising:
   a first source of light at a first wavelength;
   a partially reflective element coupled to said first source of said light at said first wavelength;
   a first photoelectric conversion device configured to detect a first portion of said light at said first wavelength transmitted through said partially reflective element and generating a first electrical sense signal;
   a second photoelectric conversion device configured to detect a second portion of said light at said first wavelength reflected by said partially reflective element and generating a second electrical sense signal;
   a comparator circuit configured to receive said first and second electrical sense signals and generating an output signal corresponding to a comparison between said first and second electrical sense signals;
   a control circuit coupled to said comparator circuit, said control circuit adjusting said first wavelength of said light in response to said output signal;
   a second source of light at a second wavelength different than said first wavelength;

a third photoelectric conversion device coupled to said second source and generating a detection signal in response to said light at said second wavelength; and a circuit coupled to said second photoelectric conversion device, said second photoelectric conversion device supplying said detection signal to said circuit, said circuit being configured to facilitate modulation of said light at said first wavelength.

13. An optical device in accordance with claim 12, wherein said first source comprises a laser.

14. An optical device in accordance with claim 12, wherein said partially reflective element comprises an in-fiber Bragg grating.

15. An optical device in accordance with claim 12, wherein said first wavelength of said light is dependent upon a temperature of said first source, said optical device further comprising:

a temperature regulating device coupled to receive a control signal generated by said control circuit in response to said output signal, said temperature regulating device adjusting a temperature of said first source in response to said control signal to thereby adjust said first wavelength.

16. An optical device in accordance with claim 12, wherein said circuit comprises:

a modulation circuit coupled to receive said detection signal, said modulation circuit outputting a modulation signal in accordance with said detection signal; and an optical modulator configured to receive said modulation signal to modulate said light at said first wavelength.

17. An optical device in accordance with claim 16, wherein said optical modulator comprises a Mach-Zehnder interferometer.

18. A method of regulating a wavelength of light output from a laser, comprising the steps of:

transmitting said light through a partially transmissive element having a transmission characteristic whereby a minimum transmissivity is obtained at a predetermined wavelength;

increasing said wavelength in first increments until a transmissivity of said light increases at a first wavelength;

decreasing said wavelength in second increments until said transmissivity of said light increases at a second wavelength; and adjusting said wavelength to be a third wavelength between said first and second wavelengths.

19. A method in accordance with claim 18, further comprising the steps of:

changing said wavelength in third increments less than said first increments until said transmissivity of said light through said filtering element increases at a fourth wavelength between said first and third wavelengths;

changing said wavelength in fourth increments less than said second increments until said transmissivity of said light through said filtering element increases at a fifth wavelength between said second and third wavelengths; and adjusting said wavelength to be sixth wavelength between said fourth and fifth wavelengths.

20. A method in accordance with claim 18, wherein if said first increments are equal to a predetermined value, said method further comprising the steps of:

changing said wavelength in said first increments until said transmissivity of said light through said filtering element increases at a fourth wavelength between said first and third wavelengths;

changing said wavelength in said second increments until said transmissivity of said light through said filtering element increases at a fifth wavelength between said second and third wavelengths; and adjusting said wavelength to be a sixth wavelength between said fourth and fifth wavelengths.

21. A method in accordance with claim 18, wherein said increasing step further comprises the steps of:

monitoring a temperature of said laser; and delaying successive ones of said first increments of said wavelength at least until said temperature of said laser is substantially constant.

22. A method in accordance with claim 18, wherein said partially transmissive element comprises an in-fiber Bragg grating, said method further comprising the steps of:

monitoring a temperature of said in-fiber Bragg grating; and discontinuing said increasing and decreasing steps when said temperature exceeds a first value or falls below a second value.

23. A method in accordance with claim 18, further comprising the step of generating an alarm signal when an intensity of said light output from said laser exceeds a first value or falls below a second value.

24. A method of regulating a wavelength of light output from a laser, comprising the steps of:

reflecting said light off a partially reflective element having a reflectivity characteristic whereby a maximum reflectivity is obtained at a predetermined wavelength;

increasing said wavelength in first increments until a reflectivity of said partially reflective element decreases at a first wavelength;

decreasing said wavelength in second increments until said reflectivity of reflective element decreases at a second wavelength; and adjusting said wavelength to be a third wavelength between said first and second wavelengths.

25. A method in accordance with claim 24, further comprising the steps of:

changing said wavelength in third increments less than said first increments until said reflectivity of said partially reflective element decreases at a fourth wavelength between said second and third wavelengths;

changing said wavelength in fourth increments less than said second increments until said reflectivity of said partially reflective element decreases at a fifth wavelength; and adjusting said wavelength to be a sixth wavelength between said fourth and fifth wavelengths.

26. A method in accordance with claim 24, wherein if said first increments are equal to a predetermined value, said method further comprising the steps of:

changing said wavelength in said first increments until said reflectivity of said partially reflective element decreases at a fourth wavelength;

changing said wavelength in said second increments until said reflectivity of said partially reflective element decreases at a fifth wavelength; and adjusting said wavelength to be a sixth wavelength between said fourth and fifth wavelengths.

27. A method in accordance with claim 24, wherein said increasing step further comprises the steps of:

monitoring a temperature of said laser; and delaying successive ones of said first increments of said wavelength at least until said temperature of said laser is substantially constant.

28. A method in accordance with claim 24, wherein said partially reflective element comprises an in-fiber Bragg grating, said method further comprising the steps of:

monitoring a temperature of said in-fiber Bragg grating; and discontinuing said increasing and decreasing steps when said temperature exceeds a first value or falls below a second value.

29. A method in accordance with claim 24, wherein said method further comprising the step of generating an alarm signal when an intensity of said light output from said laser exceeds a first value or falls below a second value.

30. An optical device, comprising:

a laser;

an optical filtering element coupled to an output of said laser, said optical filtering element having a transmissivity characteristic in which a minimum transmissivity is obtained at a predetermined wavelength;

means, coupled to said laser, for increasing a wavelength of light output from said laser in first increments until a transmissivity of said optical filtering element increases at a first wavelength;

means, coupled to said laser, for decreasing said wavelength in second increments until a transmissivity of said optical filtering element increases at a second wavelength; and means, coupled to said laser, for adjusting said wavelength to be a third wavelength between said first and second wavelengths.

31. An optical device in accordance with claim 30, wherein said optical filtering element comprises an in-fiber Bragg grating.

32. An optical device, comprising:

a laser;

a reflective element coupled to an output of said laser, said reflective element having a reflectivity characteristic in which a maximum reflectivity is obtained at a predetermined wavelength;

means, coupled to said laser, for increasing a wavelength of light output from said laser in first increments until a reflectivity of said reflective element decreases at a first wavelength;

means, coupled to said laser, for decreasing said wavelength in second increments until a reflectivity of said reflective element decreases at a second wavelength; and means, coupled to said laser, for adjusting said wavelength to be a third wavelength between said first and second wavelengths.

33. An optical device in accordance with claim 32, wherein said filtering element comprises an in-fiber Bragg grating.

34. An optical device, comprising:

a laser;

an optical filtering element coupled to an output of said laser, said optical filtering element having a transmissivity characteristic in which a minimum transmissivity is obtained at a predetermined wavelength and a reflectivity characteristic in which a peak reflectivity is obtained at said predetermined wavelength;

means for detecting a first portion of said output of said laser reflected from said optical filtering element and generating a first detection signal;

means for detecting a second portion of said light output from said laser transmitted through said optical filtering element and generating a second detection signal;

means for comparing said first and second detection signals;

means for increasing a wavelength of light output from said laser in first increments in response to said comparison until a transmissivity of said optical filtering element increases at a first wavelength;

means for decreasing said wavelength in second increments in response to said comparison until a transmissivity of said optical filtering element increases at a second wavelength; and means, coupled to said laser, for adjusting said wavelength to be a third wavelength between said first and second wavelengths.

35. An optical device in accordance with claim 34, wherein said optical filtering element comprises an in-fiber Bragg grating.

36. An optical device, comprising:

a laser;

an optical filtering element coupled to an output of said laser, said optical filtering element having a transmissivity characteristic in which a minimum transmissivity is obtained at a predetermined wavelength and a reflectivity characteristic in which a peak reflectivity is obtained at said predetermined wavelength;

means for detecting a first portion of said output of said laser reflected from said optical filtering element and generating a first detection signal;

means for detecting a second portion of said light output from said laser transmitted through said optical filtering element and generating a second detection signal;

means for comparing said first and second detection signals;

means for increasing a wavelength of light output from said laser in first increments in response to said comparison until a reflectivity of said optical filtering element decreases at a first wavelength;

means for decreasing said wavelength in second increments in response to said comparison until a reflectivity of said optical filtering element decreases at a second wavelength; and means, coupled to said laser, for adjusting said wavelength to be a third wavelength between said first and second wavelengths.

37. An optical device in accordance with claim 36, wherein said optical filtering element comprises an in-fiber Bragg grating.

38. An optical device in accordance with claim 4, wherein said in-fiber Bragg grating has a spectral width substantially equal to one angstrom.

* * * * *